US012648211B2

(12) United States Patent
Shin et al.

(10) Patent No.: US 12,648,211 B2
(45) Date of Patent: Jun. 2, 2026

(54) SEMICONDUCTOR DEVICE INCLUDING METAL-2 DIMENSIONAL MATERIAL-SEMICONDUCTOR JUNCTION

(71) Applicant: Samsung Electronics Co., Ltd., Suwon-si (KR)

(72) Inventors: Keunwook Shin, Yongin-si (KR); Eunkyu Lee, Suwon-si (KR); Changseok Lee, Suwon-si (KR); Changhyun Kim, Seoul (KR); Kyung-Eun Byun, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 563 days.

(21) Appl. No.: 18/151,775

(22) Filed: Jan. 9, 2023

(65) Prior Publication Data

US 2023/0343846 A1      Oct. 26, 2023

(30) Foreign Application Priority Data

Apr. 25, 2022    (KR) ........................ 10-2022-0051030

(51) Int. Cl.
*H10D 64/62*          (2025.01)
(52) U.S. Cl.
CPC .................................. *H10D 64/62* (2025.01)
(58) Field of Classification Search
CPC ........ H10D 64/62; H10D 30/62; H10D 30/60; H10D 30/601; H10D 30/6219; H10D 30/6729; H10D 30/6737; H10D 30/6743; H10D 64/251; H10D 62/80; H10D 62/83; H10D 62/832; H10D 62/882; H10D 30/473

(Continued)

(56) References Cited

U.S. PATENT DOCUMENTS 8,476,765  B2    7/2013  Zhang et al.
8,541,769  B2    9/2013  Chu et al.

(Continued)

FOREIGN PATENT DOCUMENTS

CN        107437505  B      4/2020
EP          3096347  A1    11/2016

(Continued)

OTHER PUBLICATIONS

Extended European Search Report dated Sep. 20, 2023 for corresponding European Application No. 23166804.7.

(Continued)

*Primary Examiner* — Monica D Harrison
(74) *Attorney, Agent, or Firm* — HARNESS, DICKEY & PIERCE, P.L.C.

(57)          ABSTRACT
A semiconductor device may include a first semiconductor layer including a first semiconductor material; a metal layer facing the first semiconductor layer and having conductivity; a 2D material layer between the first semiconductor layer and the metal layer; and a second semiconductor layer between the first semiconductor layer and the 2D material layer. The second semiconductor layer may include a second semiconductor material different from the first semiconductor material. The second semiconductor layer and the 2D material layer may be in direct contact with each other. The second semiconductor material may include germanium.

16 Claims, 14 Drawing Sheets

(58) Field of Classification Search
    USPC .......................................................... 257/382
    See application file for complete search history.

(56)                    References Cited

U.S. PATENT DOCUMENTS

|  |  |  |
|---|---|---|
| 9,482,960 B2 | 11/2016 | Yakunin et al. |
| 10,090,386 B2 | 10/2018 | Lee et al. |
| 10,312,329 B2 | 6/2019 | Zhou |
| 10,559,660 B2 | 2/2020 | Lee et al. |
| 2014/0158989 A1 | 6/2014 | Byun et al. |
| 2016/0343805 A1 | 11/2016 | Lee et al. |
| 2019/0348466 A1 | 11/2019 | Pillarisetty et al. |
| 2022/0048773 A1 | 2/2022 | Song et al. |
| 2022/0140100 A1* | 5/2022 | Cho .................. H10D 30/0275 257/288 |

FOREIGN PATENT DOCUMENTS

| KR | 10-2017-0094814 A | 8/2017 |
|---|---|---|
| KR | 10-2216543 B1 | 2/2021 |

OTHER PUBLICATIONS

Xiaohu Zheng et al. "Fluorinated Graphene in Interface Engineering of Ge-Based Nanoelectronics," Adv. Funct. Mater. 2015, pp. 1-9.

* cited by examiner

SEMICONDUCTOR DEVICE INCLUDING METAL-2 DIMENSIONAL MATERIAL-SEMICONDUCTOR JUNCTION

CROSS-REFERENCE TO RELATED APPLICATION

This application is based on and claims priority under 35 U.S.C. § 119 to Korean Patent Application No. 10-2022-0051030, filed on Apr. 25, 2022, in the Korean Intellectual Property Office, the disclosure of which is incorporated by reference herein in its entirety.

BACKGROUND

1. Field

The present disclosure relates to a semiconductor device, and more particularly, to a semiconductor device in which contact resistance is reduced by interposing a two-dimensional (2D) material layer having a 2D crystal structure between a metal layer and a semiconductor layer.

2. Description of the Related Art

A semiconductor device may include a junction of a metal and a semiconductor in a specific portion of the semiconductor device in order to exchange electrical signals with the outside. This is because metals have relatively lower resistance than semiconductors and may be easy to wire to the outside. However, in this case, contact resistance is generated due to the semiconductor/metal heterojunction. In order to reduce the contact resistance, various methods for lowering a Schottky energy barrier between a semiconductor and a metal have been proposed.

SUMMARY

Provided are semiconductor devices in which a 2D material layer is disposed between a metal layer and a semiconductor layer.

Additional aspects will be set forth in part in the description which follows and, in part, will be apparent from the description, or may be learned by practice of the presented embodiments of the disclosure.

According to an embodiment, a semiconductor device may include a first semiconductor layer including a first semiconductor material; a metal layer facing the first semiconductor layer and having conductivity; a 2D material layer between the first semiconductor layer and the metal layer; and a second semiconductor layer between the first semiconductor layer and the 2D material layer, the second semiconductor layer including a second semiconductor material different from the first semiconductor material. The second semiconductor layer and the 2D material layer may be in direct contact with each other, and the second semiconductor material may include germanium.

In some embodiments, the first semiconductor material may be represented by A, the first semiconductor layer may be represented by $A_{1-x}Ge_x$, the second semiconductor layer may be represented by $A_{1-y}Ge_y$, where $0 \leq x < 1$, $0 < y \leq 1$, and $x < y$.

In some embodiments, an amount of germanium in the second semiconductor layer may be in a range of about 50 at % to about 100 at %.

In some embodiments, the first semiconductor material may include, for example, at least one of silicon, a compound semiconductor, and an oxide semiconductor.

In some embodiments, the first semiconductor material may include silicon. The first semiconductor layer may include $Si_{1-x}Ge_x$, and the second semiconductor layer may include $Si_{1-y}Ge_y$, where $0 \leq x < 1$, $0 < y \leq 1$, and $x < y$.

In some embodiments, a thickness of the second semiconductor layer may be in a range of about 1 nm to about 1 μm.

In some embodiments, the 2D material layer may include intrinsic graphene or nanocrystalline graphene.

In some embodiments, the 2D material layer may include the nanocrystalline graphene and a ratio of carbon having a $sp^2$ bond structure to total carbon of the nanocrystalline graphene may be in a range of about 50% to about 99%.

In some embodiments, the 2D material layer may include the nanocrystalline graphene and the nanocrystalline graphene may include crystals having a size, for example, in a range of about 0.5 nm to about 500 nm.

In some embodiments, the 2D material layer may include the nanocrystalline graphene and the nanocrystalline graphene may include hydrogen, for example, in a range of about 1 at % to about 20 at %.

In some embodiments, the 2D material layer may include the nanocrystalline graphene and the nanocrystalline graphene may have a density, for example, in a range of about 1.6 g/cc to about 2.1 g/cc.

In some embodiments, the semiconductor device may further include a channel region doped a first conductivity type; a gate insulating layer on the channel region; and a gate electrode on the gate insulating film. The first semiconductor layer may include a source region and a drain region doped a second conductivity type that is electrically opposite the first conductivity type, and the source region and the drain region may be separated from each other with the channel region therebetween.

In some embodiments, the second semiconductor layer may include a first germanium-including semiconductor layer on the source region and a second germanium-including semiconductor layer on the drain region, and the first germanium-including semiconductor layer and the second germanium-including semiconductor layer may be separated from each other.

In some embodiments, the first germanium-including semiconductor layer and the second germanium-including semiconductor layer may be doped the second conductivity type.

In some embodiments, the 2D material layer may include a first 2D material layer on the first germanium-including semiconductor layer and a second 2D material layer on the second germanium-including semiconductor layer.

In some embodiments, a lower surface of the first germanium-including semiconductor layer may be in direct contact with the source region and an upper surface of the first germanium-including semiconductor layer may be in direct contact with the first 2D material layer. A lower surface of the second germanium-including semiconductor layer may be in direct contact with the drain region and an upper surface of the second germanium-including semiconductor layer may be in direct contact with the second 2D material layer.

In some embodiments, the metal layer may include a source electrode on the first 2D material layer and a drain electrode on the second 2D material layer.

In some embodiments, the semiconductor device may further include a gate electrode; and a gate insulating layer on the gate electrode. The first semiconductor layer may include a channel layer on the gate insulating layer.

In some embodiments, the metal layer may include a source electrode facing a first side surface of the channel layer and a drain electrode facing a second side surface of the channel layer. The 2D material layer may include a first 2D material layer and a second 2D material layer. The first 2D material layer may be between the source electrode and the first side surface of the channel layer. The second 2D material layer may be between the drain electrode and the second side surface of the channel layer. The second semiconductor layer may include a first germanium-including semiconductor layer and a second germanium-including semiconductor layer. The first germanium-including semiconductor layer may be between the first 2D material layer and the first side surface of the channel layer. The second germanium-including semiconductor layer may be between the second 2D material layer and the second side surface of the channel layer.

In some embodiments, the first 2D material layer and the second 2D material layer may be separated from each other.

In some embodiments, the first 2D material layer and the first germanium-including semiconductor layer may be bent and may extend from the first side surface of the channel layer to a first region of an upper surface of the channel layer, and the second 2D material layer. The second germanium-including semiconductor layer may be bent and may extend from the second side surface of the channel layer to a second region of the upper surface of the channel layer.

In some embodiments, the semiconductor device may further include a gate insulting film and a gate electrode on the gate insulating layer. The first semiconductor layer may include a channel layer and the gate insulating layer may be on an upper surface of the channel layer.

In some embodiments, the second semiconductor layer may include a first germanium-including semiconductor layer on the upper surface of the channel layer and a second germanium-including semiconductor layer on the upper surface of the channel layer. The first germanium-including semiconductor layer and the second germanium-including semiconductor layer may be separated from each other. The gate insulating layer may be between the first germanium-including semiconductor layer and the second germanium-including semiconductor layer.

In some embodiments, the 2D material layer may include a first 2D material layer on the first germanium-including semiconductor layer and a second 2D material layer on the second germanium-including semiconductor layer, and the metal layer may include a source electrode on the first 2D material layer and a drain electrode on the second 2D material layer.

In some embodiments, a lower surface of the first germanium-including semiconductor layer may be in direct contact with the channel layer, an upper surface of the first germanium-including semiconductor layer may be in direct contact with the first 2D material layer, a lower surface of the second germanium-including semiconductor layer may be in direct contact with the channel layer, and an upper surface of the second germanium-including semiconductor layer may be in direct contact with the second 2D material layer.

In some embodiments, the semiconductor device may further include a substrate and the first semiconductor layer may protrude from an upper surface of the substrate.

In some embodiments, the metal layer may include a first portion in the first semiconductor layer and a second portion protruding on an upper surface of the first semiconductor layer.

In some embodiments, the 2D material layer may surround the first portion of the metal layer, the 2D material layer may be between the first semiconductor layer and the first portion of the metal layer, the second semiconductor layer may surround the 2D material layer, and the second semiconductor layer may be between the first semiconductor layer and the 2D material layer.

According to an embodiment, a semiconductor device may include a first semiconductor layer including a first semiconductor material; a metal layer facing the first semiconductor layer; a two-dimensional (2D) material layer between the first semiconductor layer and the metal layer; and a second semiconductor layer between a surface of the first semiconductor layer and a surface of the 2D material layer, the second semiconductor layer including a second semiconductor material different from the first semiconductor material. The second semiconductor layer and the 2D material layer may contact each other. The second semiconductor material may include germanium. The second semiconductor layer may contact the surface of the first semiconductor layer. No interfacial layer combining oxygen, the first semiconductor material, and a material of the 2D material layer may be between the second semiconductor layer and the surface of the first semiconductor layer.

In some embodiments, the second semiconductor layer may directly contact the surface of the first semiconductor layer.

In some embodiments, the second semiconductor layer may directly contact the surface of the 2D material layer.

In some embodiments, the 2D material layer may include intrinsic graphene or nanocrystalline graphene.

In some embodiments, the first semiconductor layer may include $Si_{1-x}Ge_x$, and the second semiconductor layer may include $Si_{1-y}Ge_y$, where $0 \leq x < 1$, $0 < y \leq 1$, and $x < y$.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
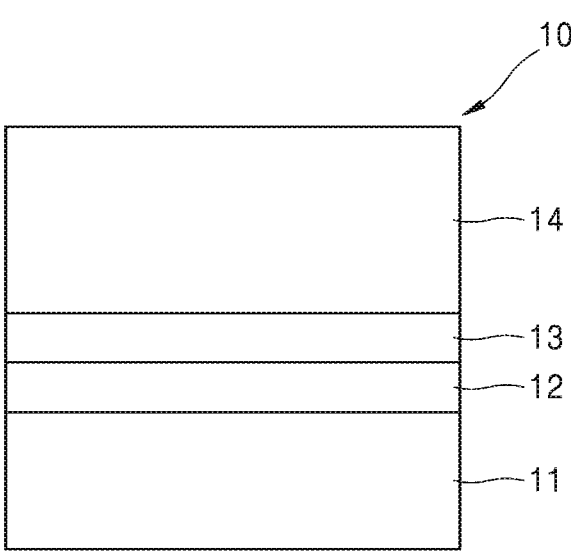
FIG. 1 is a schematic cross-sectional view illustrating a structure of a semiconductor device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

Hereinafter, a semiconductor device including a metal-two-dimensional (2D) material-semiconductor junction will be described in detail with reference to the accompanying drawings. Like reference numerals indicate elements that are substantially identical or correspond to each other, and the descriptions thereof will not be repeated. Embodiments of inventive concepts are capable of various modifications and may be embodied in many different forms.

It will be understood that when an element or layer is referred to as being "on" or "above" another element or layer, the element or layer may be directly on another element or layer or intervening elements or layers. The singular forms "a," "an" and "the" are intended to include the plural forms as well, unless the context clearly indicates otherwise. It should be understood that, when a part "comprises" or "includes" an element in the specification, unless otherwise defined, other elements are not excluded from the part and the part may further include other elements.

The term "above" and similar directional terms may be applied to both singular and plural. With respect to operations that constitute a method, the operations may be performed in any appropriate sequence unless the sequence of operations is clearly described or unless the context clearly indicates otherwise.

Also, in the specification, the term "units" or " . . . modules" denote units or modules that process at least one function or operation, and may be realized by hardware, software, or a combination of hardware and software.

The connections of lines and connection members between constituent elements depicted in the drawings are examples of functional connection and/or physical or circuitry connections, and thus, in practical devices, may be expressed as replaceable or additional functional connections, physical connections, or circuitry connections.

All examples or example terms (for example, etc.) are simply used to explain in detail the technical scope of inventive concepts, and thus, the scope of inventive concepts is not limited by the examples or the example terms as long as it is not defined by the claims.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a schematic cross-sectional view illustrating a structure of a semiconductor device 10 according to an embodiment. Referring to FIG. 1, the semiconductor device 10 according to an embodiment may include a first semiconductor layer 11, a second semiconductor layer 12 disposed on the first semiconductor layer 11, a 2D material layer 13 disposed on the second semiconductor layer 12, and a metal layer 14 having conductivity (e.g., electrical conductivity) disposed on the 2D material layer 13. Here, the expression "disposed on" is for convenience of description and does not necessarily mean a vertical relationship. In other words, the metal layer 14 may be disposed to face the first semiconductor layer 11. The 2D material layer 13 may be disposed between the first semiconductor layer 11 and the conductive metal layer 14. The second semiconductor layer 12 may be disposed between the first semiconductor layer 11 and the 2D material layer 13.

The first semiconductor layer 11 may include a first semiconductor material. The first semiconductor material of the first semiconductor layer 11 may include, for example, a Group IV semiconductor, such as silicon (Si) or germanium (Ge); a Group III-V compound semiconductor, such as GaN, GaAs, GaP, etc.; a Group II-VI compound semiconductor, such as CdS, ZnTe, etc.; a Group IV-IV compound semiconductor, such as SiC, etc.; an oxide semiconductor, such as IGZO, etc.; or a semiconductor having a 2D crystal structure having a band gap, such as $MoS_2$, etc. When the semiconductor device 10 is applied to a transistor, the first semiconductor layer 11 may be used as a source region, a drain region, or a channel region.

The second semiconductor layer 12 may include a second semiconductor material that is different from the first semiconductor material. For example, the second semiconductor material of the second semiconductor layer 12 may include Ge. The second semiconductor layer 12 may include only the second semiconductor material, but may also include a mixture of the first semiconductor material and the second semiconductor material. Alternatively, both the first semiconductor layer 11 and the second semiconductor layer 12 may include a mixture of the first semiconductor material and the second semiconductor material. In this case, a ratio of the first semiconductor material to the second semiconductor material in the first semiconductor layer 11 may be different from a ratio of the first semiconductor material to the second semiconductor material in the second semiconductor layer 12. The ratio of the first semiconductor material may be relatively high in the first semiconductor layer 11, and the ratio of the second semiconductor material may be relatively high in the second semiconductor layer 12. For example, when the first semiconductor material is A, the first semiconductor layer 11 may include $A_{1-x}Ge_x$, the second semiconductor layer 12 may include $A_{1-y}Ge_y$, where $0 \leq x < 1$, $0 < y \leq 1$, and may be $x < y$. Also, for example, when the first semiconductor layer 11 may include Si, the second semiconductor layer 12 may include Ge or SiGe. Alternatively, the first semiconductor layer 11 may include $Si_{1-x}Ge_x$, the second semiconductor layer 12 may include $Si_{1-y}Ge_y$, where $0 \leq x < 1$, $0 < y \leq 1$, and may be $x < y$. In other words, a ratio of Ge in the second semiconductor layer 12 may be greater than 0 at % and less than 100 at %. Alternatively, the ratio of Ge in the second semiconductor layer 12 may be in a range of about 30 at % to about 100 at %, or in a range of about 50 at % to about 100 at %, or in a range of about 70 at % to about 100 at %.

The 2D material layer 13 may include a 2D material having a 2D crystal structure. The 2D material layer 13 may include a single layer structure or a multiple layer structure. When the 2D material layer 13 includes a multiple layer structure, the plurality of layers in the multiple layer structure may have a very weak interaction through van der Waals bonding. The 2D material layer 13 may have, for example, a thickness in a range of about 0.3 nm to about 5 nm. The thickness of the 2D material layer 13 may be easily controlled through the number of stacked layers of the 2D material.

The 2D material layer 13 may include a carbon-based 2D material or a non-carbon-based 2D material. A carbon-based 2D material may be a 2D material formed by crystals of a carbon element. For example, the 2D material layer 13 may include intrinsic graphene or nanocrystalline graphene as a carbon-based 2D material. The intrinsic graphene is crystalline graphene and may include crystals greater than about 100 nm. The nanocrystalline graphene may include crystals having a size less than that of the intrinsic graphene. For example, the nanocrystalline graphene may include crystals having a size in a range of about 0.5 nm to about 500 nm. In some embodiments, the nanocrystalline graphene may include crystals having a size in a range of about 0.5 nm to about 100 nm. In the intrinsic graphene, a ratio of carbon having a sp$^2$ bonding structure to all carbon, which is measured through an X-ray photoelectron spectroscopy (XPS) analysis, may be almost 100%. The intrinsic graphene may include little or no hydrogen. Density of the intrinsic graphene may be, for example, about 2.1 g/cc. In the nanocrystalline graphene, a ratio of carbon having a sp$^2$ bond structure to the total carbon may be, for example, in a range of about 50% to about 99%. And, the nanocrystalline graphene may include, for example, in a range of about 1 at % to about 20 at % of hydrogen. In addition, the density of the nanocrystalline graphene may be, for example, in a range of about 1.6 g/cc to about 2.1 g/cc. The intrinsic graphene may be formed by using a chemical vapor deposition (CVD) method at a temperature in a range of about 700° C. to about 1000° C., and the nanocrystalline graphene may be formed by using inductively coupled plasma chemical vapor deposition (ICP-CVD) method or plasma enhanced CVD (PE-CVD) method at a temperature of about 600° C. or less.

The non-carbon-based 2D material may be a 2D material including elements other than carbon. A transition metal dichalcogenide (TMD), which is a compound of a transition metal and a chalcogen element, may be a typical non-carbon-based 2D material. The 2D material layer 13 may include at least one of, for example, $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $Wte_2$, $TaTe_2$, $HfTe_2$, $ReTe_2$, $TiTe_2$, $NbTe_2$, and $SnTe_2$, as a transition metal dichalcogenide. Also, the 2D material layer 13 may include various other non-carbon-based 2D materials in addition to the transition metal dichalcogenide. For example, the 2D material layer 13 may include at least one of, for example, hexagonal BN (h-BN), phosphorene, TiOx, NbOx, MnOx, VaOx, $MnO_3$, $TaO_3$, $WO_3$, $MoCl_2$, $CrCl_3$, $RuCl_3$, $BiI_3$, $PbCl_4$, GeS, GaS, GeSe, GaSe, $PtSe_2$, $In_2Se_3$, GaTe, InS, InSe, and InTe, as another non-carbon-based 2D material. Here, h-BN is formed in a hexagonal crystal structure by combining boron (B) and nitrogen (N). Phosphorene is a 2D allotrope of black phosphorus.

The 2D material layer 13 may use the materials described above as it is, or may be doped to improve electrical properties of the semiconductor device 10. In other words, the 2D material layer 13 may have a doped structure by substituting other elements for some of the elements constituting the 2D crystal structure thereof or by additionally combining other elements with the 2D crystal structure. For example, when the 2D material layer 13 is graphene, some of carbon atoms constituting the graphene may be substituted with other atoms, such as boron or nitrogen, or some of the carbon atoms may combine with other atoms, such as boron or nitrogen.

The metal layer 14 may include a conductive metal material to serve as an electrode. For example, the metal layer 14 may include at least one of magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pb), silver (Ag), cadmium (Cd), indium (In), tin (Sn), lanthanum (La), hafnium (Hf), tantalum (Ta), tungsten (W), iridium (Ir), platinum (Pt), gold (Au), bismuth (Bi), cobalt (Co), ruthenium (Ru), and rhodium (Rh) or an alloy thereof. Alternatively, the metal layer 14 may include a metal nitride material having conductivity (e.g., electrical conductivity). For example, the metal layer 14 may include TiN or TaN.

Because there are few reactive groups on a surface of the 2D material layer 13, a pinning phenomenon of a work function of a metal material of the metal layer 14 on a surface of the first semiconductor layer 11 may be eliminated. Accordingly, an effect according to the intrinsic work function of the metal material of the metal layer 14 may appear, and as a result, a contact resistance may be reduced. In other words, the 2D material layer 13 may serve to reduce a contact resistance by reducing a Schottky energy barrier between the first semiconductor layer 11 and the metal layer 14.

Meanwhile, the 2D material layer 13 may be formed by directly growing the aforementioned 2D material on the second semiconductor layer 12. For example, the 2D material layer 13 may be formed on an upper surface of the second semiconductor layer 12 by using a CVD method, an ICP-CVD method, or a PE-CVD method. Accordingly, the 2D material layer 13 may directly contact the second semiconductor layer 12. The second semiconductor layer 12 may perform a role of limiting and/or preventing an interfacial layer from being formed due to oxidation of the first semiconductor material in a process of growing the 2D material layer 13.

When the 2D material layer 13 is directly grown on the first semiconductor layer 11, an interfacial layer may be formed by combining oxygen in the chamber with the first semiconductor material of the first semiconductor layer 11 and the material of the 2D material layer 13 in the process of growing the 2D material layer 13. The interfacial layer may rather increase a contact resistance. For example, when the first semiconductor material includes silicon and the 2D material layer 13 includes intrinsic graphene or nanocrystalline graphene, if the 2D material layer 13 is directly grown on the first semiconductor layer 11, a SiOC layer may be formed between the first semiconductor layer 11 and the 2D material layer 13 by combining oxygen, silicon, and carbon. Because the SiOC has a relatively stable state, it is not easy to remove the SiOC during the formation of the 2D material layer 13.

On the other hand, when the 2D material layer 13 is directly grown on the second semiconductor layer 12 including Ge, GeOC or GeC may be mainly formed. Because the GeOC or GeC has a relatively unstable structure, the GeOC or GeC may be naturally vaporized and readily removed at a deposition temperature of the 2D material layer 13. Accordingly, when the 2D material layer 13 is directly grown on the second semiconductor layer 12 including Ge, the interface layer may hardly be formed between the second semiconductor layer 12 and the 2D material layer 13.

Figure 2:
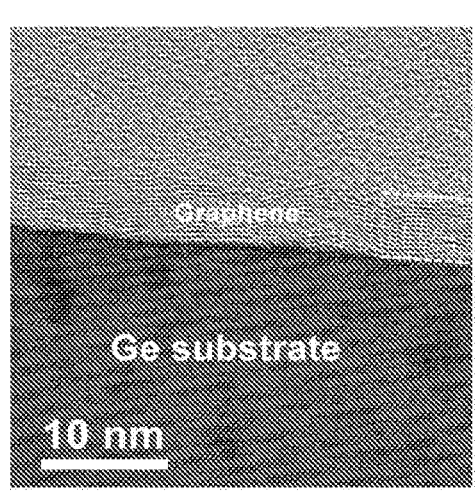
FIG. 2 is a transmission electron microscope (TEM) image showing a structure in which graphene is directly grown on germanium, according to an embodiment.
Figure 3:
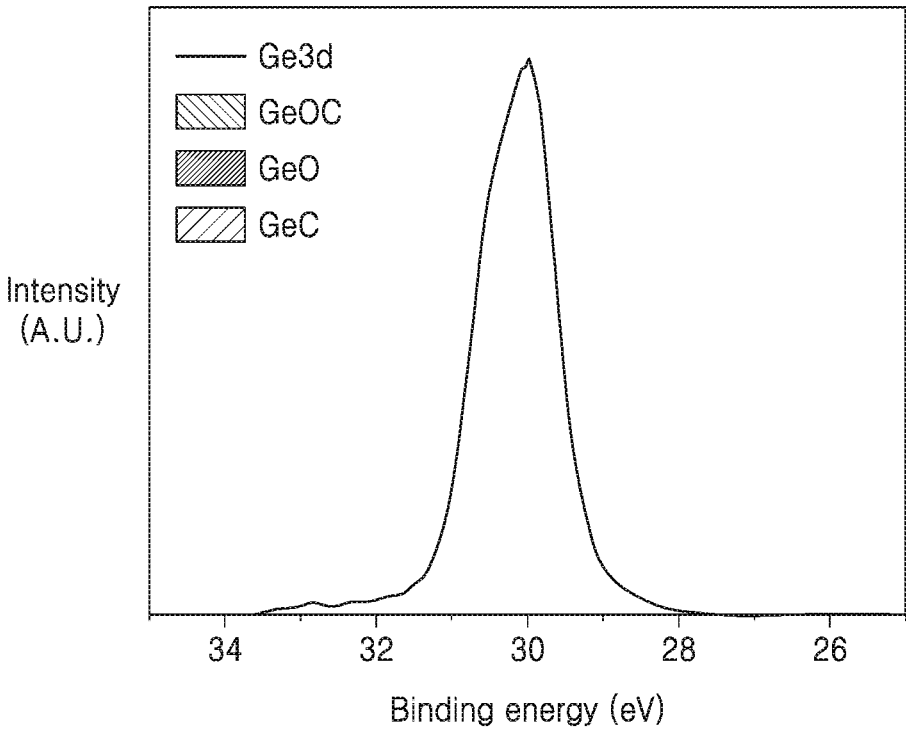
FIG. 3 is a graph showing a result of X-ray photoelectron spectroscopy (XPS) analysis of the structure shown in FIG. 2.

For example, FIG. 2 is a transmission electron microscope (TEM) image showing a structure in which graphene is directly grown on Ge according to an embodiment. Referring to FIG. 2, it may be seen that graphene is formed on germanium without an interfacial layer between germanium and graphene. Also, FIG. 3 is a graph showing a result of X-ray photoelectron spectroscopy (XPS) analysis of the structure shown in FIG. 2. Referring to FIG. 3, it may be seen that there is no shoulder peak that may indicate the formation of GeOC, GeO, or GeC.

Figure 4:
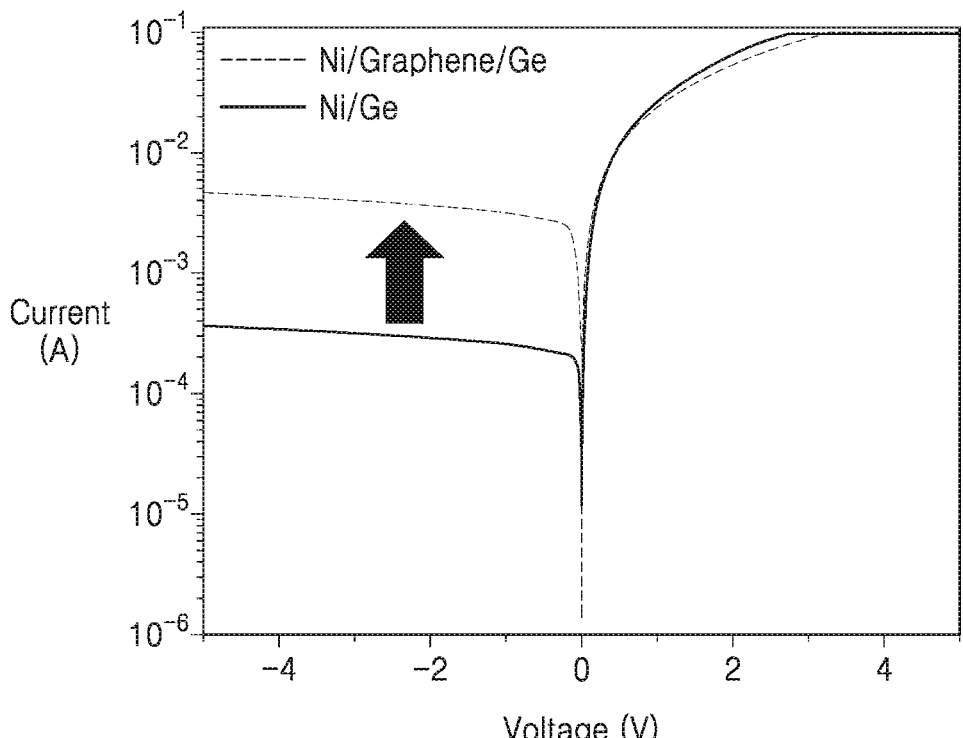
FIG. 4 is a graph showing voltage-current characteristics of the structure shown in FIG. 2.

FIG. 4 is a graph showing a voltage-current characteristic for the structure shown in FIG. 2. In the graph of FIG. 4, a graph indicated by a solid line shows a voltage-current characteristic of a structure in which nickel is directly stacked on germanium for comparison, and a graph indicated by a dotted line shows a voltage-current characteristic of a structure in which graphene is disposed between germanium and nickel. Referring to the graph of FIG. 4, in the structure in which graphene is disposed between germanium and nickel, it may be confirmed that a current increases as a result of decreasing a contact resistance.

Figure 5:
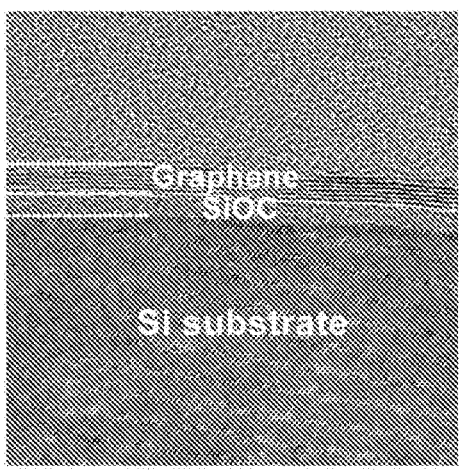
FIG. 5 is a TEM image showing a structure in which graphene is directly grown on silicon, according to a comparative example.
Figure 6:
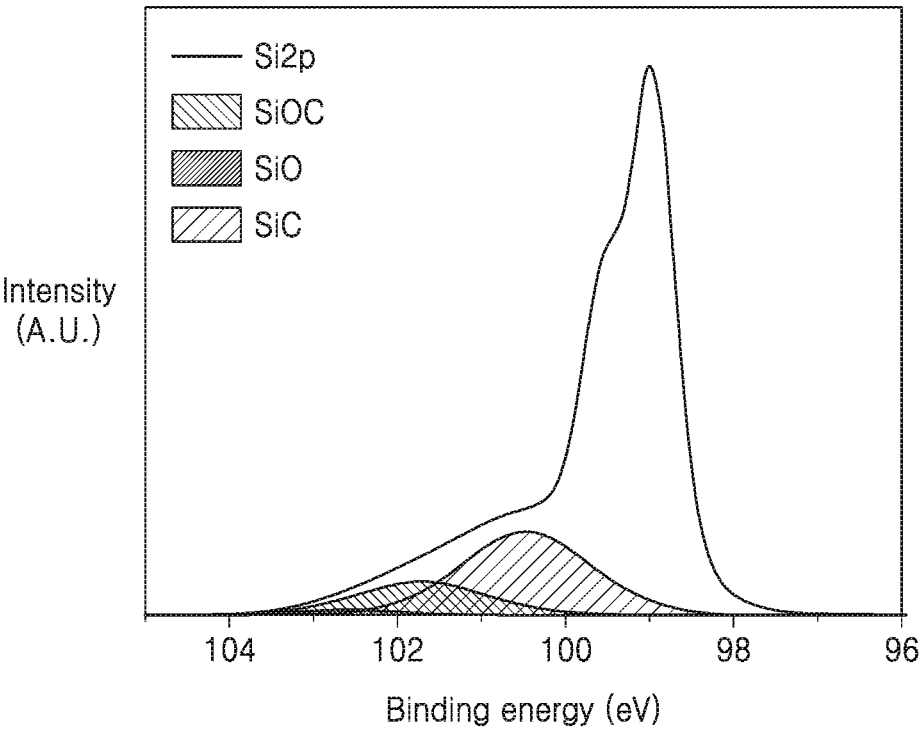
FIG. 6 is a graph showing a result of an XPS analysis of the structure shown in FIG. 5.

FIG. 5 is a TEM image showing a structure in which graphene is directly grown on silicon according to a comparative example. Referring to FIG. 5, it may be seen that SiOC is formed between silicon and graphene when graphene is directly grown on silicon. Also, FIG. 6 is a graph showing a result of an XPS analysis for the structure shown in FIG. 5. Referring to FIG. 6, it may be seen that a shoulder peak that may indicate the formation of SiOC, SiC, and SiO appears.

Figure 7:
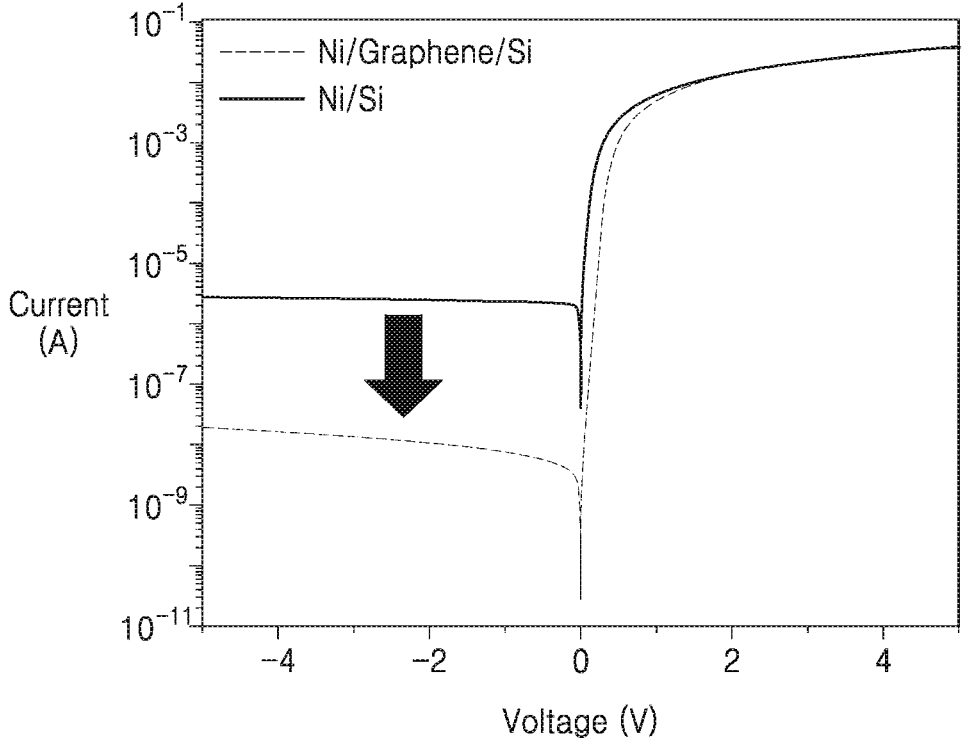
FIG. 7 is a graph showing voltage-current characteristics of the structure shown in FIG. 5.

FIG. 7 is a graph showing a voltage-current characteristic for the structure shown in FIG. 5. In FIG. 7, a graph indicated by a solid line shows a voltage-current characteristic of a structure in which nickel is directly stacked on silicon for comparison, and a graph indicated by a dotted line shows a voltage-current characteristic of a structure in which graphene is disposed between silicon and nickel. Referring to the graph of FIG. 7, in a structure in which graphene is disposed between silicon and nickel, the contact resistance is rather increased due to an interface layer formed between silicon and graphene in a process of growing graphene on silicon, and thus, the a current is decreased.

As described above, when the 2D material layer 13 is formed on the first semiconductor layer 11, by growing the 2D material layer 13 on the second semiconductor layer 12 including germanium, the formation of an interface layer between the first semiconductor layer 11 and the 2D material layer 13 may be suppressed or reduced. Accordingly, it is possible to limit and/or prevent an increase in contact resistance due to the interface layer formed between the first semiconductor layer 11 and the 2D material layer 13.

Meanwhile, because the second semiconductor layer 12 is for the purpose of limiting and/or preventing the formation of an interface layer, the thickness of the second semiconductor layer 12 does not need to be greater than the thickness of the first semiconductor layer 11. In other words, the thickness of the second semiconductor layer 12 may be less than the thickness of the first semiconductor layer 11. For example, the thickness of the second semiconductor layer 12 may be selected and determined within a range of 1 nm to 1 μm according to the use of the semiconductor device 10.

Figure 8:
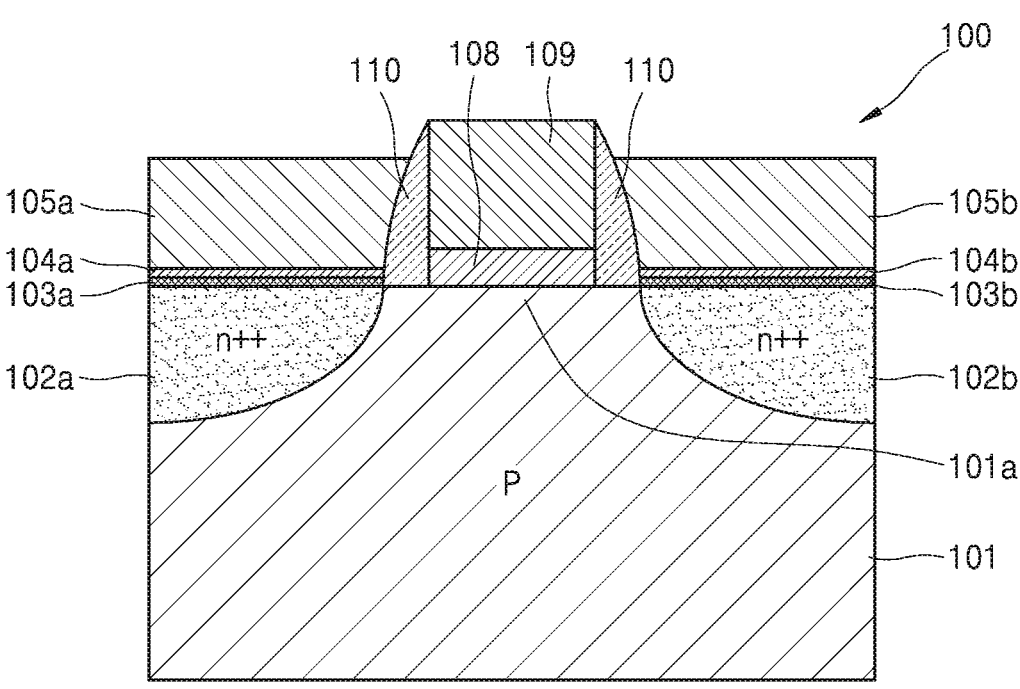
FIG. 8 is a schematic cross-sectional view illustrating a structure of a field-effect transistor according to an embodiment.

The semiconductor device 10 described above may be applied to various devices, such as field-effect transistors. For example, FIG. 8 is a schematic cross-sectional view illustrating a structure of a field-effect transistor 100 according to an embodiment. Referring to FIG. 8, the field-effect transistor 100 may include a well region 101 doped with a first conductivity type, a source region 102a doped with a second conductivity type electrically opposite to the first conductivity type, a drain region 102b doped with the second conductively type, a first germanium-including semiconductor layer 103a disposed on the source region 102a, a second germanium-including semiconductor layer 103b disposed on the drain region 102b, a first 2D material layer 104a disposed on the first germanium-including semiconductor layer 103a, a second 2D material layer 104b disposed on the second germanium-including semiconductor layer 103b, a source electrode 105a disposed on the first 2D material layer 104a, a drain electrode 105b disposed on the second 2D material layer 104b, a gate insulating layer 108 disposed on the well region 101, and a gate electrode 109 disposed on the gate insulating layer 108.

In FIG. 8, it is depicted that the well region 101 is doped with a P-type and the source region 102a and drain region 102b are doped with an N-type, but this is only an example, and the well region 101 may be doped with an N-type and the source region 102a and the drain region 102b may doped with a P-type. The well region 101 may be doped with a relatively low concentration in a range of about $10^{14}/cm^3$ to about $10^{18}/cm^3$, and the source region 102a and the drain region 102b may be doped with a relatively high concentration of about $10^{19}/cm^3$ or more to reduce a depletion width.

The source region 102a and the drain region 102b may be disposed on both sides of an upper surface of the well region 101. For example, after forming the well region 101 by doping the semiconductor substrate with a P-type, the source region 102a and the drain region 102b may be formed by doping both sides of the upper surface of the semiconductor substrate with an N-type. The well region 101 may include a channel region 101a between the source region 102a and the drain region 102b. Like the well region 101, the channel region 101a may be doped with a first conductivity type. The source region 102a and the drain region 102b may be separated from each other with the channel region 101a therebetween. Here, the source region 102a and the drain region 102b may correspond to the first semiconductor layer 11 illustrated in FIG. 1. In other words, when the field-effect transistor 100 shown in FIG. 8 corresponds to the semiconductor device 10 shown in FIG. 1, the first semiconductor layer 11 may include the source region 102a and the drain region 102b.

The first germanium-including semiconductor layer 103a and the second germanium-including semiconductor layer 103b may be doped with the same conductivity type as the source region 102a and the drain region 102b respectively disposed thereunder. In other words, the first germanium-including semiconductor layer 103a and the second germanium-including semiconductor layer 103b may be doped with a second conductivity type. The first germanium-including semiconductor layer 103a and the second germanium-including semiconductor layer 103b may be separated from each other with the gate insulating layer 108 therebetween. The first germanium-including semiconductor layer 103a and the second germanium-including semiconductor layer 103b may correspond to the second semiconductor layer 12 illustrated in FIG. 1. In other words, when the field-effect transistor 100 shown in FIG. 8 corresponds to the semiconductor device 10 shown in FIG. 1, the second semiconductor layer 12 may include the first germanium-including semiconductor layer 103a and the second germanium-including semiconductor layer 103b.

The first 2D material layer 104a and the second 2D material layer 104b may serve to reduce contact resistance. The first 2D material layer 104a and the second 2D material layer 104b may be separated from each other with the gate insulating layer 108 therebetween. The first 2D material layer 104a and the second 2D material layer 104b may correspond to the 2D material layer 13 illustrated in FIG. 1. In other words, when the field-effect transistor 100 shown in FIG. 8 corresponds to the semiconductor device 10 shown in FIG. 1, the 2D material layer 13 may include the first 2D material layer 104a and the second 2D material layer 104b.

The first germanium-including semiconductor layer 103a limits and/or prevents an interface layer from being formed between the source region 102a and the first 2D material layer 104a, and the second germanium-including semiconductor layer 103b may limit and/or prevent an interface layer from being formed between the drain region 102b and the second 2D material layer 104b. Accordingly, a lower surface of the first germanium-including semiconductor layer 103a may be in direct contact with the source region 102a and an upper surface of the first germanium-including semiconductor layer 103a may be in direct contact with the first 2D material layer 104a. Also, a lower surface of the second germanium-including semiconductor layer 103b may be in direct contact with the drain region 102b and an upper surface of the second germanium-including semiconductor layer 103b may be in direct contact with the second 2D material layer 104b.

The source electrode 105a disposed on the first 2D material layer 104a and the drain electrode 105b disposed on the second 2D material layer 104b may correspond to the metal layer 14 illustrated in FIG. 1. In other words, when the field-effect transistor 100 shown in FIG. 8 corresponds to the semiconductor device 10 shown in FIG. 1, the metal layer 14 may include the source electrode 105a and the drain electrode 105b. The source electrode 105a and the drain electrode 105b may be separated from each other with the gate electrode 109 therebetween.

The gate insulating layer 108 may be disposed on an upper surface of the well region 101, in particular, on an upper surface of the channel region 101a. The gate insulating layer 108 may include at least one dielectric material selected from among $SiO_2$, SiNx, $HfO_2$, and $Al_2O_3$. The gate electrode 109 disposed on the gate insulating layer 108 may include polysilicon or a metal material. The gate electrode 109 may be include the same metal material as the metal material of the source electrode 105a and the drain electrode 105b.

The field-effect transistor 100 may further include a spacer 110 surrounding sidewalls of the gate insulating layer 108 and the gate electrode 109. The spacer 110 may limit and/or prevent the gate insulating layer 108 and the gate electrode 109 from directly contacting the source electrode 105a and the drain electrode 105b. The spacer 110 may include an insulating material, such as $SiO_2$, SiNx, etc.

Figure 9:
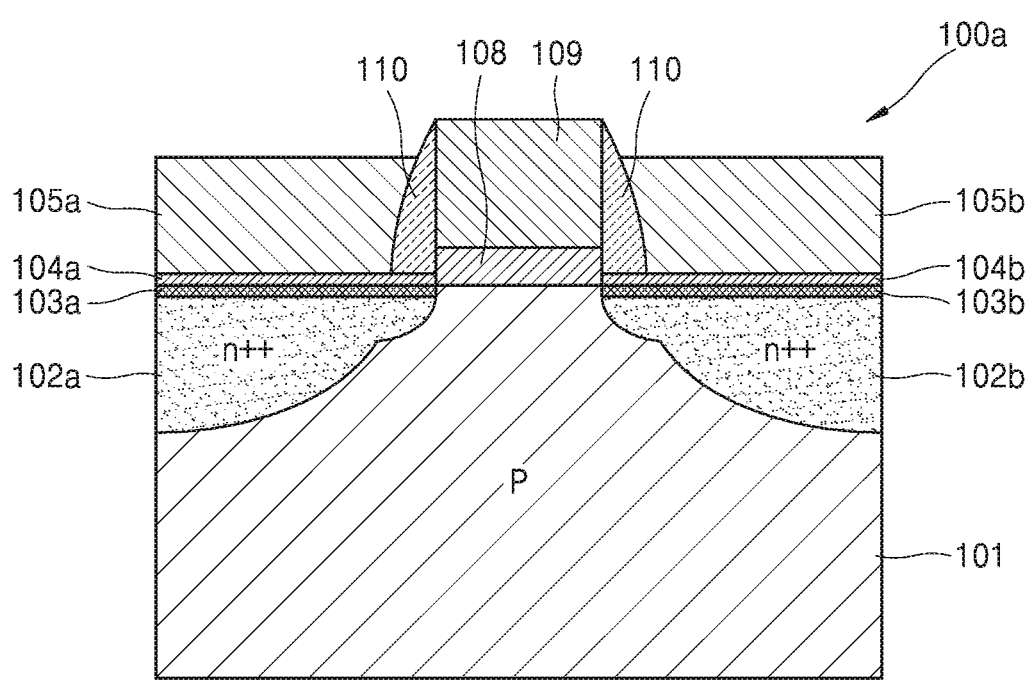
FIG. 9 is a schematic cross-sectional view illustrating a structure of a field-effect transistor according to another embodiment.

FIG. 9 is a schematic cross-sectional view illustrating a structure of a field-effect transistor 100 according to another embodiment. In the field-effect transistor 100 shown in FIG. 8, upper surfaces of the well region 101, the source region 102a, and the drain region 102b are coplanar, and the first and second 2D material layers 104a and 104b extend to contact side surfaces of the spacer 110. On the other hand, in the field-effect transistor 100a shown in FIG. 9, the first and second 2D material layers 104a and 104b extend to contact lower surfaces of the spacer 110. To this end, the upper surface of the well region 101 may be formed to be higher than the upper surfaces of the source region 102a and the drain region 102b. The first and second 2D material layers 104a and 104b may extend along a lower surface of the spacer 110 to an interface between the spacer 110 and the gate insulating layer 108. In this case, the first germanium-including semiconductor layer 103a and the second germanium-including semiconductor layer 103b may also extend to the interface between the spacer 110 and the gate insulating layer 108.

Figure 10:
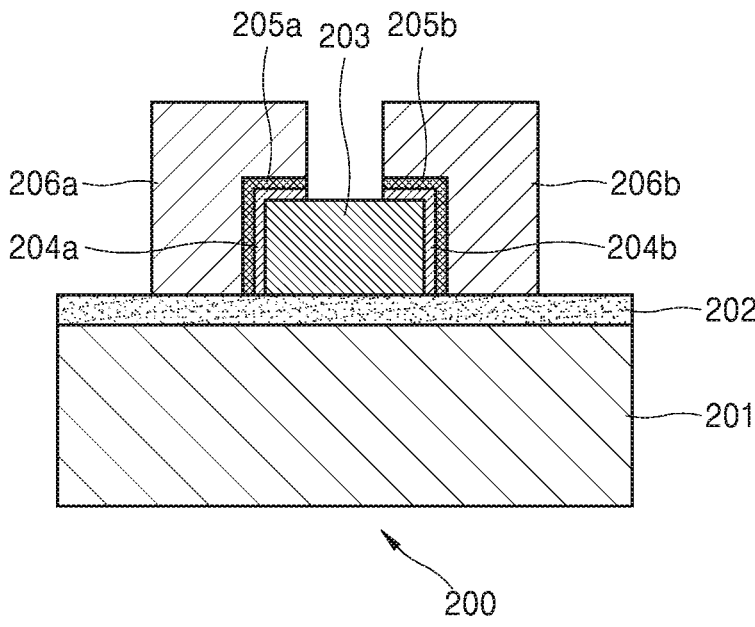
FIG. 10 is a schematic cross-sectional view illustrating a structure of a field-effect transistor according to another embodiment.

FIG. 10 is a schematic cross-sectional view illustrating a structure of a field-effect transistor 200 according to another embodiment. Referring to FIG. 10, the field-effect transistor 200 may include a gate electrode 201, a gate insulating layer 202 on the gate electrode 201, a channel layer 203 on the gate insulating layer 202, a source electrode 206a disposed to face a first side surface of the channel layer 203 and electrically contacting the channel layer 203, a drain electrode 206b disposed to face a second side surface of the channel layer 203 and electrically contacting the channel layer 203, a first 2D material layer 205a disposed between the first side surface of the channel layer 203 and the source electrode 206a, a second 2D material layer 205b disposed between the second side surface of the channel layer 203 and the drain electrode 206b, a first germanium-including semiconductor layer 204a disposed between the first 2D material layer 205a and the first side surface of the channel layer 203, and a second germanium-including semiconductor layer 204b disposed between the second 2D material layer 205b and the second side surface of the channel layer 203.

The channel layer 203 may correspond to the first semiconductor layer 11 illustrated in FIG. 1. In other words, when the field-effect transistor 200 shown in FIG. 10 corresponds to the semiconductor device 10 shown in FIG. 1, the first semiconductor layer 11 may include the channel layer 203 disposed on the gate insulating layer 202. The channel layer 203 may be undoped.

The source electrode 206*a* and the drain electrode 206*b* may correspond to the metal layer 14 shown in FIG. 1. In other words, when the field-effect transistor 200 shown in FIG. 10 corresponds to the semiconductor device 10 shown in FIG. 1, the metal layer 14 may include the source electrode 206*a* disposed to face the first side surface of the channel layer 203 and the drain electrode 206*b* disposed to face the second side surface of the channel layer 203.

The first 2D material layer 205*a* and the second 2D material layer 205*b* may correspond to the 2D material layer 13 illustrated in FIG. 1. In other words, when the field-effect transistor 200 shown in FIG. 10 corresponds to the semiconductor device 10 shown in FIG. 1, the 2D material layer 13 may include the first 2D material layer 205*a* disposed between the source electrode 206*a* and the first side surface of the channel layer 203 and the second 2D material layer 205*b* disposed between the drain electrode 206*b* and the second side surface of the channel layer 203. The first 2D material layer 205*a* may extend from the first side surface of the channel layer 203 to a partial region of an upper surface of the channel layer 203. Also, the second 2D material layer 205*b* may extend from the second side surface of the channel layer 203 to another partial region of the upper surface of the channel layer 203 so as not to contact the first 2D material layer 205*a*. Accordingly, the first and second 2D material layers 205*a* and 205*b* may be bent by about 90 degrees between the side surfaces and the upper surface of the channel layer 203.

The first germanium-including semiconductor layer 204*a* and the second germanium-including semiconductor layer 204*b* may correspond to the second semiconductor layer 12 illustrated in FIG. 1. In other words, when the field-effect transistor 200 shown in FIG. 10 corresponds to the semiconductor device 10 shown in FIG. 1, the second semiconductor layer 12 may include the first germanium-including semiconductor layer 204*a* disposed between the first 2D material layer 205*a* and the first side surface of the channel layer 203 and the second germanium-including semiconductor layer 204*b* disposed between the second 2D material layer 205*b* and the second side surface of the channel layer 203. The first germanium-including semiconductor layer 204*a* may extend from the first side surface of the channel layer 203 to a partial region of the upper surface of the channel layer 203. Also, the second germanium-including semiconductor layer 204*b* may extend from the second side surface of the channel layer 203 to another partial region of the upper surface of the channel layer 203 so as not to contact the first germanium-including semiconductor layer 204*a*. Accordingly, the first and second germanium-including semiconductor layers 204*a* and 204*b* may be bent by about 90 degrees between the side surfaces and the upper surface of the channel layer 203.

Figure 11:
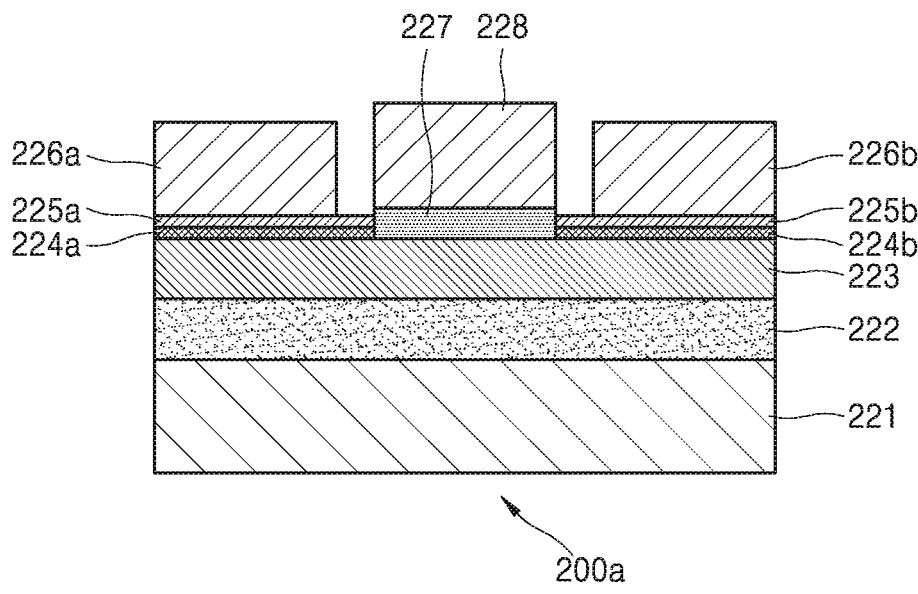
FIG. 11 is a schematic cross-sectional view illustrating a structure of a field-effect transistor according to another embodiment.

FIG. 11 is a schematic cross-sectional view illustrating a structure of a field-effect transistor 200*a* according to another embodiment. The field-effect transistor 200 of FIG. 10 has a bottom gate structure in which a gate electrode 201 is disposed under the channel layer 203, but the field-effect transistor 200*a* illustrated in FIG. 11 is different in that it has a top gate structure. Referring to FIG. 11, the field-effect transistor 200*a* includes a substrate 221, an insulating layer 222 on an upper surface of the substrate 221, a channel layer 223 on an upper surface of the insulating layer 222, a gate insulating layer 227 disposed on a partial region of an upper surface of the channel layer 223, a gate electrode 228 disposed on an upper surface of the gate insulating layer 227, first and second germanium-including semiconductor layers 224*a* and 224*b* respectively disposed on different regions of the upper surface of the channel layer 223; a first 2D material layer 225*a* disposed on an upper surface of the first germanium-including semiconductor layer 224*a*, a second 2D material layer 225*b* disposed on an upper surface of the second germanium-including semiconductor layers 224*b*, a source electrode 226*a* disposed on an upper surface of the first 2D material layer 225*a*, and a drain electrode 226*b* disposed on an upper surface of the second 2D material layer 225*b*.

The channel layer 223 may correspond to the first semiconductor layer 11 illustrated in FIG. 1. In other words, when the field-effect transistor 200*a* shown in FIG. 11 corresponds to the semiconductor device 10 shown in FIG. 1, the first semiconductor layer 11 may include the channel layer 223 disposed on the insulating layer 222. The channel layer 223 may be undoped.

The first germanium-including semiconductor layer 224*a* and the second germanium-including semiconductor layer 224*b* may correspond to the second semiconductor layer 12 illustrated in FIG. 1. In other words, when the field-effect transistor 200*a* shown in FIG. 11 corresponds to the semiconductor device 10 shown in FIG. 1, the second semiconductor layer 12 may include the first germanium-including semiconductor layer 224*a* disposed on a first region of the upper surface of the channel layer 203 and the second germanium-including semiconductor layer 224*b* disposed on a second region of the upper surface of the channel layer 203. The first germanium-including semiconductor layer 224*a* and the second germanium-including semiconductor layer 224*b* may be separated from each other with the gate insulating layer 227 therebetween. A lower surface of the first germanium-including semiconductor layer 224*a* may be in direct contact with the channel layer 223, and an upper surface of the first germanium-including semiconductor layer 224*a* may be in direct contact with the first 2D material layer 225*a*. In addition, a lower surface of the second germanium-including semiconductor layer 224*b* may be in direct contact with the channel layer 223, and an upper surface of the second germanium-including semiconductor layer 224*b* may be in direct contact with the second 2D material layer 225*b*.

The first 2D material layer 225*a* and the second 2D material layer 225*b* may correspond to the 2D material layer 13 illustrated in FIG. 1. In other words, when the field-effect transistor 200*a* shown in FIG. 11 corresponds to the semiconductor device 10 shown in FIG. 1, the 2D material layer 13 may include the first 2D material layer 225*a* disposed on the first germanium-including semiconductor layer 224*a* and the second 2D material layer 225*b* disposed on the second germanium-including semiconductor layer 224*b*. The first 2D material layer 225*a* and the second 2D material layer 225*b* may be separated from each other with the gate insulating layer 227 therebetween.

The source electrode 226*a* and the drain electrode 226*b* may correspond to the metal layer 14 shown in FIG. 1. In other words, when the field-effect transistor 200*a* shown in FIG. 11 corresponds to the semiconductor device 10 shown in FIG. 1, the metal layer 14 may include the source electrode 226*a* disposed on the first 2D material layer 225*a* and the drain electrode 226*b* disposed on the second 2D material layer 225*b*. The source electrode 226*a* and the drain electrode 226*b* may be separated from each other with the gate electrode 228 therebetween.

Figure 12:
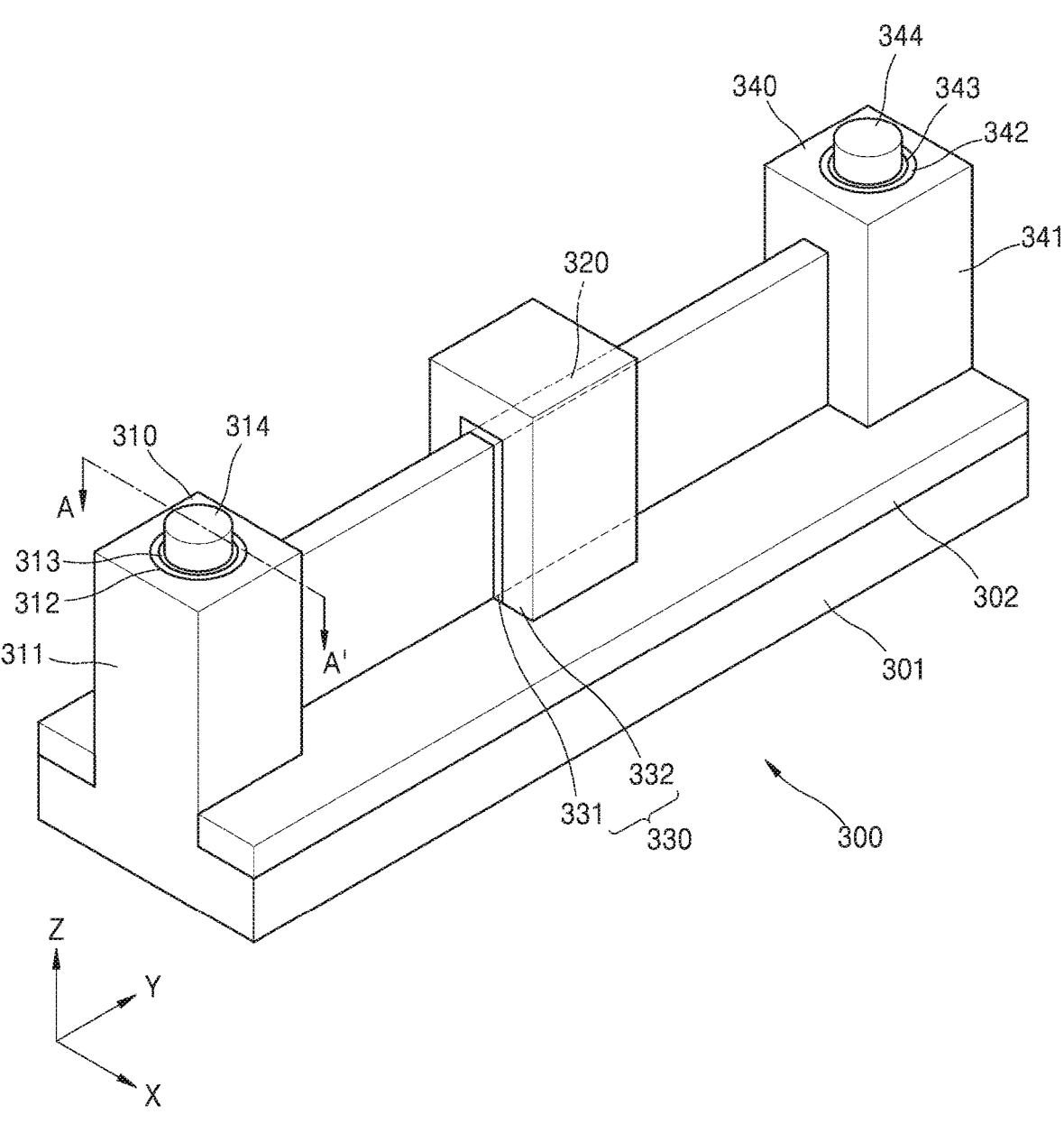
FIG. 12 is a schematic perspective view illustrating a structure of a field-effect transistor according to another embodiment.

FIG. 12 is a schematic perspective view illustrating a structure of a field-effect transistor 300 according to another embodiment. Referring to FIG. 12, the field-effect transistor 300 may include a substrate 301, a source structure 310 protruding in a Z-direction from an upper surface of the substrate 301, a drain structure 340 protruding in the Z-direction from the upper surface of the substrate 301, a channel 320 protruding in the Z-direction from the upper surface of the substrate 301 and having a bar shape extending in a Y-direction, and a gate structure 330 covering the channel 320 by surrounding the channel 320. The field-effect transistor 300 may further include a device isolation film 302 to electrically isolate the field-effect transistor 300 from another adjacent field-effect transistors (not shown). The device isolation layer 302 may include an insulating dielectric material, and may be disposed to extend in the Y-direction along both sides of the source structure 310, the channel 320, the gate structure 330, and the drain structure 340 on the upper surface of the substrate 301. The field-effect transistor 300 shown in FIG. 12 may be, for example, a Fin field-effect transistor (FinFET).

The channel 320 may extend in the Y-direction and may connect the source structure 310 to the drain structure 340. In other words, a first end of the channel 320 may contact the source structure 310 and a second end of the channel 320 may contact the drain structure 340. The channel 320 may include a P-type semiconductor doped with a relatively low concentration or an n-type semiconductor doped with a relatively low concentration.

The gate structure 330 may include a gate insulating layer 331 covering the channel 320 and a gate electrode 332 covering the gate insulating layer 331 between the source structure 310 and the drain structure 340. The gate insulating layer 331 may be disposed to protrude from the upper surface of the substrate 301 to cover three surfaces of the channel 320, that is, both side surfaces and an upper surface of the channel 320. Also, the gate electrode 332 may be disposed to protrude from the upper surface of the substrate 301 to cover three surfaces of the gate insulating layer 331, that is, both side surfaces and an upper surface of the gate insulating layer 331.

The source structure 310 may include a first semiconductor layer 311, a source electrode 314 disposed in the first semiconductor layer 311, a 2D material layer 313 disposed to surround the source electrode 314 in the first semiconductor layer 311, a second semiconductor layer 312 disposed to surround the 2D material layer 313 in the first semiconductor layer 311. Similarly, the drain structure 340 may include a first semiconductor layer 341, a drain electrode 344 disposed in the first semiconductor layer 341, a 2D material layer 343 disposed to surround the drain electrode 344 in the first semiconductor layer 341, and a second semiconductor layer 342 disposed to surround the 2D material layer 343 in the first semiconductor layer 341.

The first semiconductor layer 311 of the source structure 310 and the first semiconductor layer 341 of the drain structure 340 may be disposed to protrude from the upper surface of the substrate 301 in the Z-direction. The first semiconductor layer 311 of the source structure 310 and the first semiconductor layer 341 of the drain structure 340 may include an N-type semiconductor doped with a relatively high concentration or a P-type semiconductor doped with a relatively high concentration. Portions of the first semiconductor layer 311 of the source structure 310 and the first semiconductor layer 341 of the drain structure 340 may extend in the Y-direction to be connected to the channel 320. The portion of the first semiconductor layer 311 of the source structure 310 and the portion of the first semiconductor layer 341 of the drain structure 340 that are connected to the channel 320 may have the same width as the channel 320 in the X-direction. In addition, the other portion of the first semiconductor layer 311 of the source structure 310 and the other portion of the first semiconductor layer 341 of the drain structure 340 opposite to the channel 320 may have a width greater than the width of the channel 320.

Figure 13:
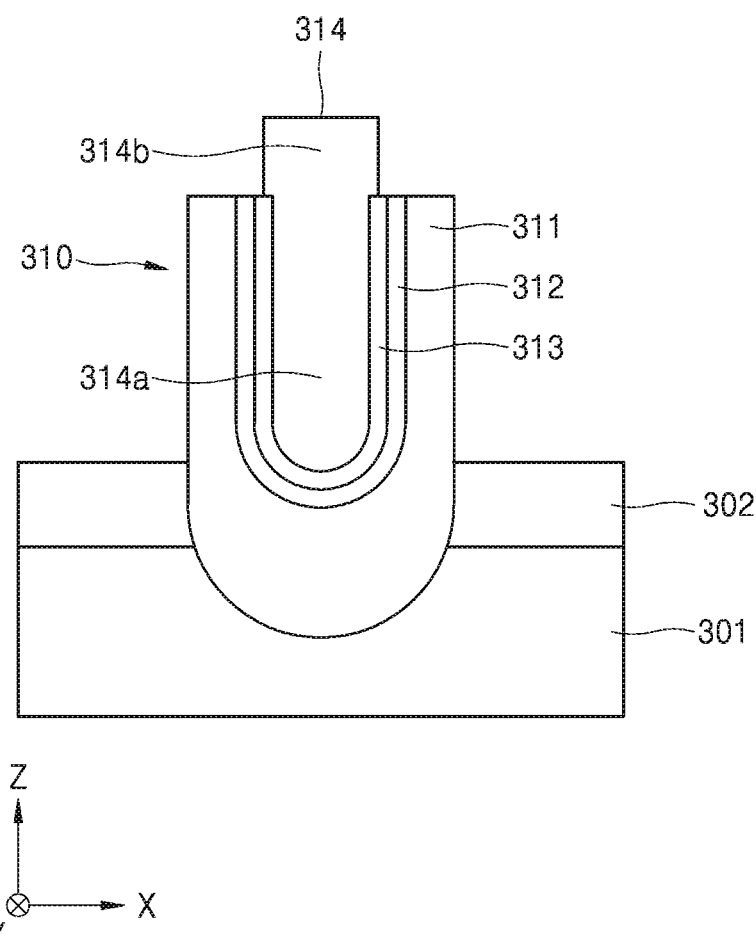
FIG. 13 is a schematic cross-sectional view illustrating the structure of a source/drain structure shown in FIG. 12.

FIG. 13 is a schematic cross-sectional view showing a structure of the source structure 310 shown in FIG. 12, in particular, a schematic cross-sectional view taken along line A-A' of the source structure 310. Referring to FIG. 13, the source electrode 314 may have a bar shape extending in the Z-direction that is different from the extending direction (Y-direction) of the channel 320. The source electrode 314 may include a first portion 314a located inside the first semiconductor layer 311 and a second portion 314b protruding along the Z-direction above the upper surface of the first semiconductor layer 311. The 2D material layer 313 may be disposed to surround the first portion 314a of the source electrode 314 between the first semiconductor layer 311 and the first portion 314a of the source electrode 314. Also, the second semiconductor layer 312 may be disposed to surround the 2D material layer 313 between the first semiconductor layer 311 and the 2D material layer 313. The second portion 314b of the source electrode 314 may cover at least a portion of the 2D material layer 313 on an upper surface of the first semiconductor layer 311. To this end, a diameter of the second portion 314b of the source electrode 314 may be greater than that of the first portion 314a. The structure of the source structure 310 described above may be equally applied to the drain structure 340.

When the field-effect transistor 300 shown in FIGS. 12 and 13 corresponds to the semiconductor device 10 shown in FIG. 1, the first semiconductor layer 11 may include the first semiconductor layer 311 of the source structure 310 and the first semiconductor layer 341 of the drain structure 340, the second semiconductor layer 12 may include the second semiconductor layer 312 of the source structure 310 and the second semiconductor layer 342 of the drain structure 340, the 2D material layer 13 may include the 2D material layer 313 of the source structure 310 and the 2D material layer 343 of the drain structure 340, and the metal layer 14 may include the source electrode 314 of the source structure 310 and the drain electrode 344 of the drain structure 340.

Although the structure of a FinFET has been described in FIGS. 12 and 13 as an example, the source structure 310 and the drain structure 340 illustrated in FIGS. 12 and 13 may be applied to other than the FinFET, for example, a gate-all-around FET (GAAFET) or a multi-bridge channel FET (MBCFET).

The semiconductor device or field-effect transistor described above may be used in, for example, a driving integrated circuit of a display, a CMOS inverter, a CMOS SRAM device, a CMOS NAND circuit, and/or various other electronic devices.

Figure 14:
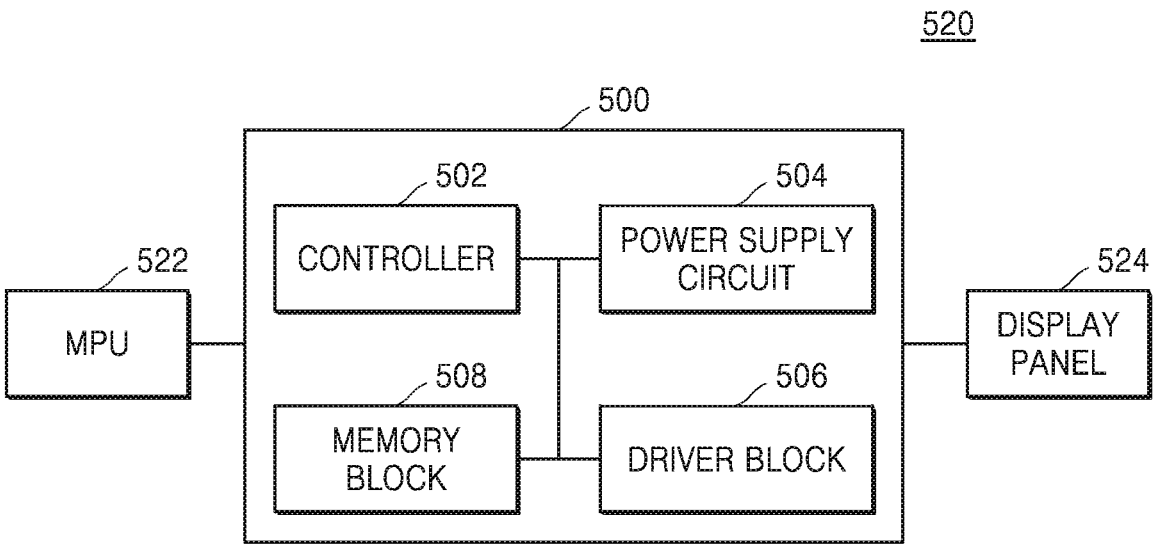
FIG. 14 is a schematic block diagram of a display driver IC (DDI) and a display device including the DDI according to an embodiment.

FIG. 14 is a schematic block diagram of a display driver IC (DDI) 500 and a display device 520 including the DDI 500 according to an embodiment. Referring to FIG. 14, the DDI 500 may include a controller 502, a power supply circuit 504, a driver block 506, and a memory block 508. The controller 502 receives and decodes a command applied from a main processing unit (MPU) 522 and controls each block of the DDI 500 to implement an operation according to the command. The power supply circuit 504 generates a driving voltage in response to the control of the controller 502. The driver block 506 drives a display panel 524 by using a driving voltage generated by the power supply circuit 504 in response to the control of the controller 502. The display panel 524 may include, for example, a liquid crystal display panel, an organic light emitting device (OLED) display panel, or a plasma display panel. The memory block 508 is a block for temporarily storing commands input to the controller 502 or control signals output from the controller 502, or for storing necessary data, and may include a memory, such as random access memory (RAM) or read only memory (ROM). The power supply circuit 504 and the driver block 506 may include a semiconductor device or a field-effect transistor according to the embodiments described above with reference to FIGS. 1 to 13.

Figure 15:
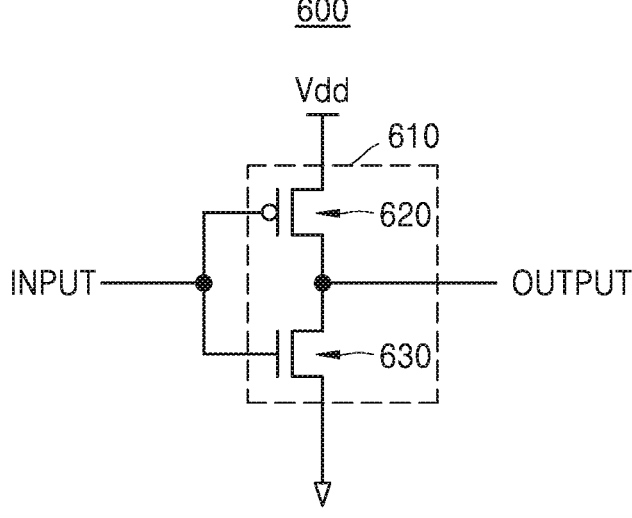
FIG. 15 is a circuit diagram of a CMOS inverter according to an embodiment.

FIG. 15 is a circuit diagram of a CMOS inverter 600 according to an embodiment. Referring to FIG. 15, the CMOS inverter 600 includes a CMOS transistor 610. The CMOS transistor 610 includes a PMOS transistor 620 and an NMOS transistor 630 connected between a power terminal Vdd and a ground terminal. The CMOS transistor 610 may include a semiconductor device or a field-effect transistor according to the embodiments described above with reference to FIGS. 1 to 13.

Figure 16:
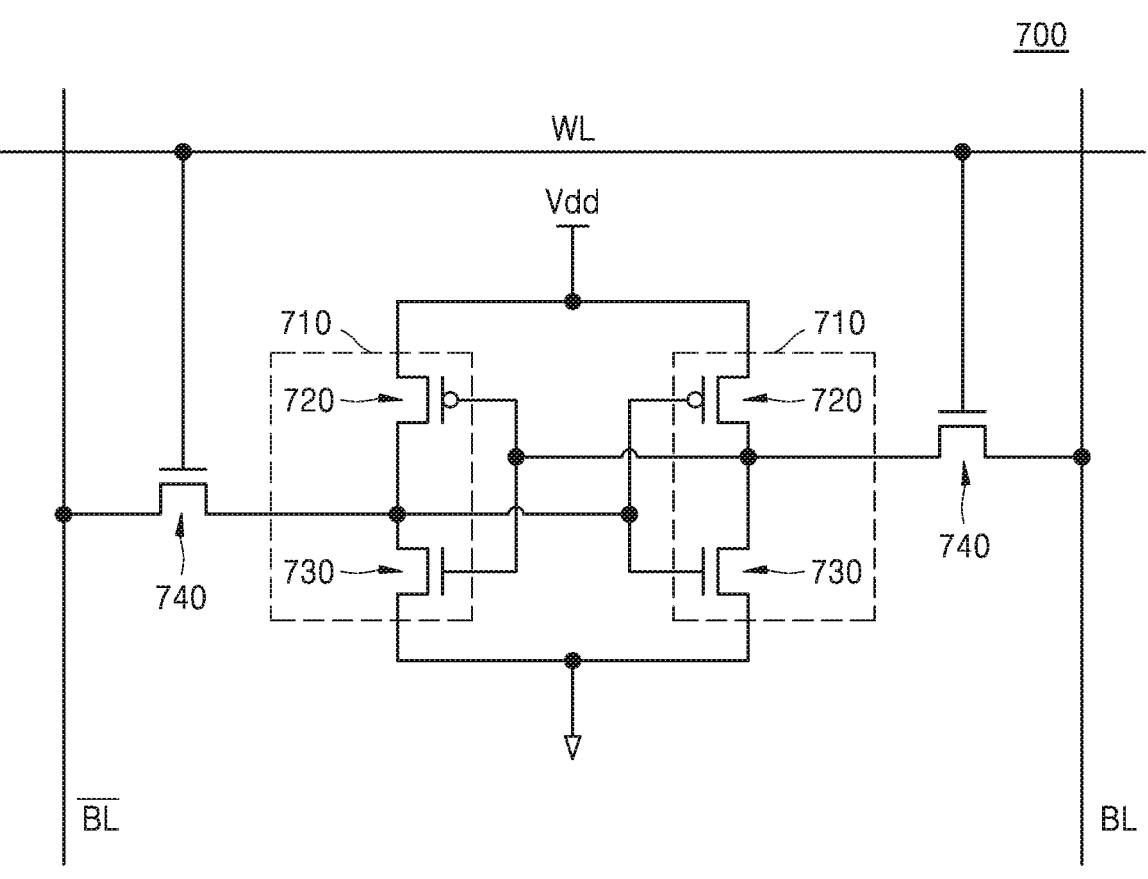
FIG. 16 is a circuit diagram of a CMOS SRAM device according to an embodiment.

FIG. 16 is a circuit diagram of a CMOS SRAM device 700 according to an embodiment. Referring to FIG. 16, the CMOS SRAM device 700 includes a pair of driving transistors 710. The pair of driving transistors 710 includes a PMOS transistor 720 and an NMOS transistor 730 connected between a power terminal Vdd and a ground terminal, respectively. The CMOS SRAM device 700 may further include a pair of transmission transistors 740. A source of the transmission transistor 740 is cross-connected to a common node of the PMOS transistor 720 and the NMOS transistor 730 constituting the driving transistor 710. A power terminal Vdd is connected to a source of the PMOS transistor 720, and a ground terminal is connected to a source of the NMOS transistor 730. A word line WL may be connected to a gate of the pair of transmission transistors 740, and a bit line BL and an inverted bit line may be connected to a drain of each of the pair of transmission transistors 740, respectively. At least one of the driving transistor 710 and the transmission transistor 740 of the CMOS SRAM device 700 may include a semiconductor device or a field-effect transistor according to the embodiments described above with reference to FIGS. 1 to 13.

Figure 17:
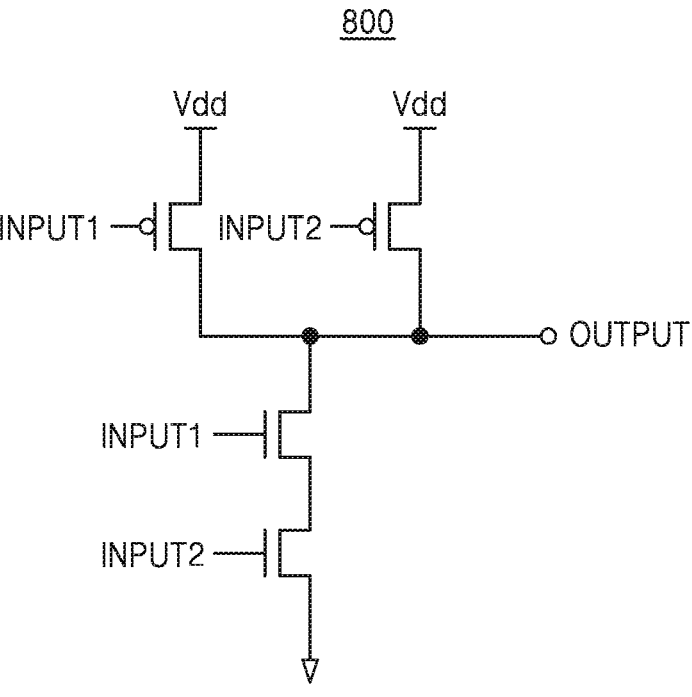
FIG. 17 is a circuit diagram of a CMOS NAND circuit according to an embodiment.

FIG. 17 is a circuit diagram of a CMOS NAND circuit 800 according to an embodiment. Referring to FIG. 17, the CMOS NAND circuit 800 includes a pair of CMOS transistors to which different input signals are transmitted. The CMOS NAND circuit 800 may include a semiconductor device or a field-effect transistor according to the embodiments described above with reference to FIGS. 1 to 13.

Figure 18:
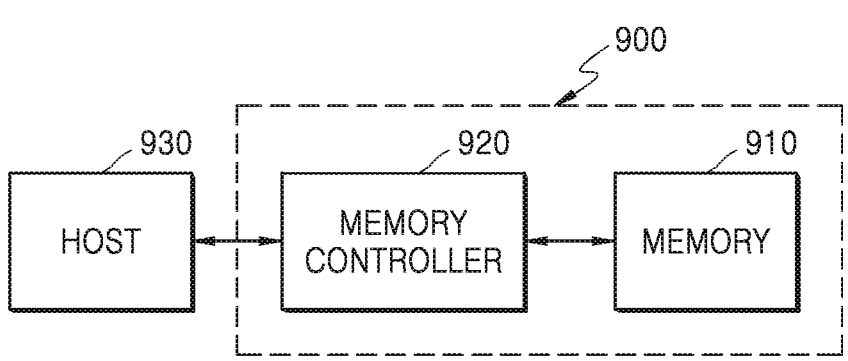
FIG. 18 is a block diagram illustrating an electronic device according to an embodiment.

FIG. 18 is a block diagram illustrating an electronic apparatus 900 according to an embodiment. Referring to FIG. 18, the electronic apparatus 900 includes a memory 910 and a memory controller 920. The memory controller 920 may control the memory 910 to read data from and/or write data into the memory 910 in response to a request from the host 930. At least one of the memory 910 and the memory controller 920 may include a semiconductor device or a field-effect transistor according to the embodiments described above with reference to FIGS. 1 to 13.

Figure 19:
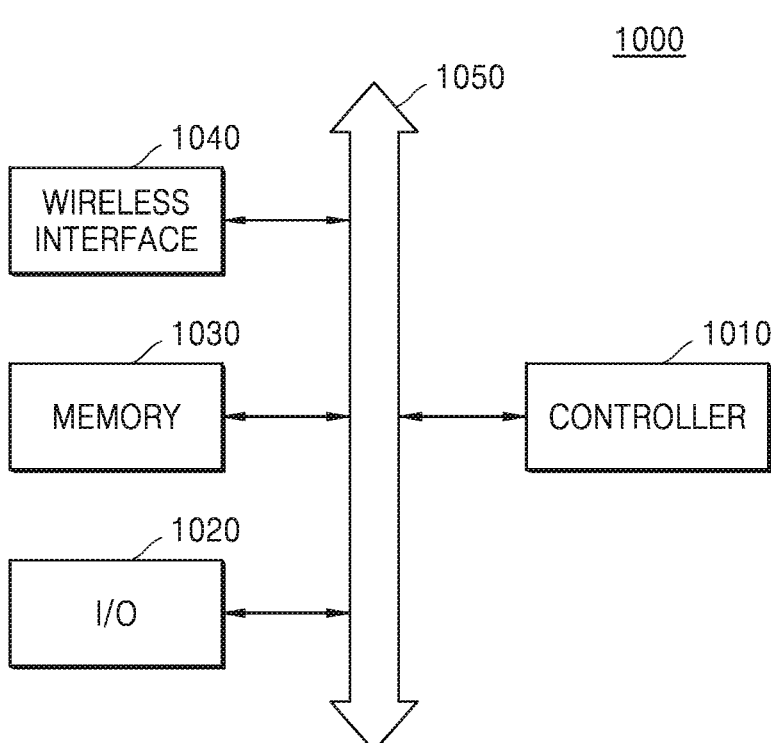
FIG. 19 is a block diagram of an electronic device according to an embodiment.

FIG. 19 is a block diagram of an electronic apparatus 1000 according to an embodiment. Referring to FIG. 19, the electronic apparatus 1000 may constitute a wireless communication device or a device capable of transmitting and/or receiving information in a wireless environment. The electronic apparatus 1000 includes a controller 1010, an input/output device (I/O) 1020, a memory 1030, and a wireless interface 1040, and these components are interconnected to each other through a bus 1050.

The controller 1010 may include at least one of a microprocessor, a digital signal processor, and a processing device similar thereto. The I/O device 1020 may include at least one of a keypad, a keyboard, and a display. The memory 1030 may be used to store instructions executed by controller 1010. For example, the memory 1030 may be used to store user data. The electronic apparatus 1000 may use the wireless interface 1040 to transmit/receive data through a wireless communication network. The wireless interface 1040 may include an antenna and/or a wireless transceiver. In some embodiments, the electronic apparatus 1000 may be used in a communication interface protocol of a third-generation communication system such as code division multiple access (CDMA), global system for mobile communications (GSM), north American digital cellular (NADC), extended-time division multiple access (E-TDMA), wide band code division multiple access (WCDMA), a 4G (4th Generation) communication system such as 4G LTE, a 5G (5th Generation) communication system, a wired local area network (LAN), a wireless local area network (WLAN), such as Wi-Fi (Wireless Fidelity), a wireless personal area network (WPAN), such as Bluetooth, Wireless USB (Wireless Universal Serial Bus), Zigbee, Near Field Communication (NFC), Radio-frequency identification (RFID), and/or Power Line communication (PLC).

The electronic apparatus 1000 may include the semiconductor device or the field-effect transistor according to the embodiments described above with reference to FIGS. 1 to 13.

Figure 20:
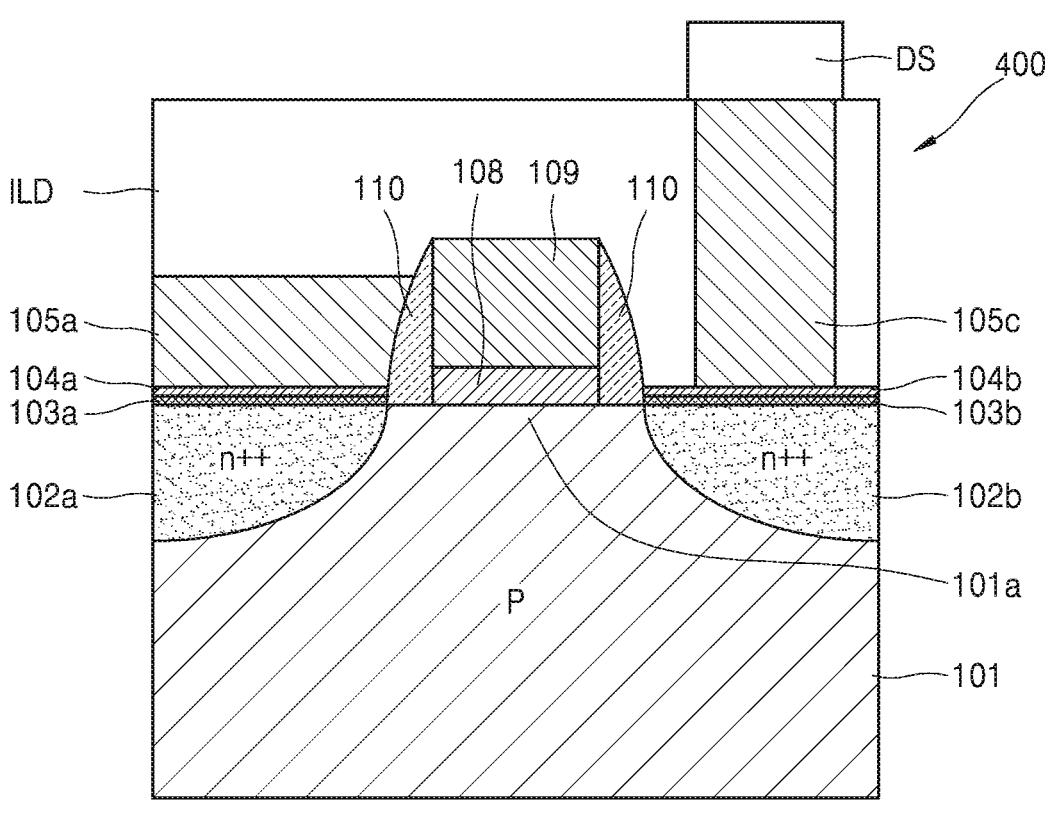
FIG. 20 shows a memory device including a field-effect transistor according to example embodiments.

FIG. 20 shows a memory device including a field-effect transistor according to example embodiments.

Referring to FIG. 20, the memory device 400 may have the same structure as the field-effect transistor 100 described above in FIG. 8, except for the following differences. In the memory device 400, the drain electrode 105b in FIG. 8 may be replaced with a conductive plug 105c, which may be formed of the same material as the drain electrode 105b but may have a different structure. The conductive plug 105c may be spaced apart from the spacer 110 and may have a width less than a width of the second 2D material layer 104b on the second germanium-including semiconductor layer 103b. An insulating layer ILD (e.g., silicon oxide) may be formed on the substrate 101 over the source electrode 105a, spacer 110, gate electrode 109, and second 2D material layer 104b. The conductive plug 105c may be taller than the source electrode 105a and may be extend through the insulating layer ILD to a top surface of the insulating layer ILD. A data storage DS, such as a capacitor or a magnetic tunnel junction, may be electrically connected to the conductive plug 105c.

The semiconductor device or the field-effect transistor according to the embodiments may exhibit high electrical performance with an ultra-small structure, and thus may be applied to an integrated circuit device, and may realize miniaturization, low power, and high performance.

While the semiconductor device including a metal-2D material semiconductor junction has been described with reference to the embodiments shown in the drawings, it will be understood by those of ordinary skill in the art that various changes in form and details may be made therein without departing from the spirit and scope of inventive concepts. Therefore, the embodiments should be considered in descriptive sense only and not for purposes of limitation.

The scope of inventive concepts is defined not by the detailed description of inventive concepts but by the appended claims, and all differences within the scope will be construed as being included in inventive concepts.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
a first semiconductor layer including a first semiconductor material;
a metal layer facing the first semiconductor layer, the metal layer having conductivity;
a two-dimensional (2D) material layer between the first semiconductor layer and the metal layer; and
a second semiconductor layer between the first semiconductor layer and the 2D material layer, the second semiconductor layer including a second semiconductor material different from the first semiconductor material, wherein
the second semiconductor layer and the 2D material layer are in direct contact with each other, and
the second semiconductor material includes germanium.

2. The semiconductor device of claim 1, wherein,
the first semiconductor material is represented by A,
the first semiconductor layer is represented by $A_{1-x}Ge_x$, and
the second semiconductor layer is represented by $A_{1-y}Ge_y$, where $0 \leq x < 1$, $0 < y \leq 1$, and $x < y$.

3. The semiconductor device of claim 1, wherein
an amount of germanium in the second semiconductor layer is in a range of about 50 at % to 100 at %.

4. The semiconductor device of claim 1, wherein
the first semiconductor material includes silicon, wherein
the first semiconductor layer includes $Si_{1-x}Ge_x$, and
the second semiconductor layer includes $Si_{1-y}Ge_y$, where $0 \leq x < 1$, $0 < y \leq 1$, and $x < y$.

5. The semiconductor device of claim 1, wherein a thickness of the second semiconductor layer is in a range of about 1 nm to about 1 μm.

6. The semiconductor device of claim 1, wherein the 2D material layer includes intrinsic graphene or nanocrystalline graphene.

7. The semiconductor device of claim 6, wherein
the 2D material layer includes the nanocrystalline graphene, a ratio of carbon having an $sp^2$ bond structure to total carbon of the nanocrystalline graphene is in a range of about 50% to about 99%,
the 2D material layer includes the nanocrystalline graphene,
the nanocrystalline graphene includes crystals having a size in a range of about 0.5 nm to about 500 nm,
the 2D material layer includes the nanocrystalline graphene,
the nanocrystalline graphene includes hydrogen in a range of about 1 at % to about 20 at %,
the 2D material layer includes the nanocrystalline graphene, and
the nanocrystalline graphene has a density in a range of about 1.6 g/cc to about 2.1 g/cc.

8. The semiconductor device of claim 1, further comprising:
a channel region doped a first conductivity type;
a gate insulating layer on the channel region; and
a gate electrode on the gate insulating layer, wherein
the first semiconductor layer includes a source region and a drain region, the source region and the drain region being doped a second conductivity type that is electrically opposite the first conductivity type, and
the source region and the drain region are separated from each other with the channel region therebetween.

9. The semiconductor device of claim 8, wherein
the second semiconductor layer includes a first germanium-including semiconductor layer on the source region and a second germanium-including semiconductor layer on the drain region,
the first germanium-including semiconductor layer and the second germanium-including semiconductor layer are separated from each other,
the first germanium-including semiconductor layer and the second germanium-including semiconductor layer are doped the second conductivity type,
the 2D material layer includes a first 2D material layer on the first germanium-including semiconductor layer and a second 2D material layer on the second germanium-including semiconductor layer,
a lower surface of the first germanium-including semiconductor layer is in direct contact with the source region,
an upper surface of the first germanium-including semiconductor layer is in direct contact with the first 2D material layer,
a lower surface of the second germanium-including semiconductor layer is in direct contact with the drain region, and
an upper surface of the second germanium-including semiconductor layer is in direct contact with the second 2D material layer.

10. The semiconductor device of claim 1, further comprising:
a gate electrode; and
a gate insulating layer on the gate electrode,
wherein the first semiconductor layer includes a channel layer on the gate insulating layer.

11. The semiconductor device of claim 10, wherein the metal layer includes:
a source electrode facing a first side surface of the channel layer; and
a drain electrode facing a second side surface of the channel layer, wherein
the 2D material layer includes a first 2D material layer and a second 2D material layer, the first 2D material layer is between the source electrode and the first side surface of the channel layer, the second 2D material layer is between the drain electrode and the second side surface of the channel layer, and the second semiconductor layer includes a first germanium-including semiconductor layer and a second germanium-including semiconductor layer, the first germanium-including semiconductor layer is between the first 2D material layer and the first side surface of the channel layer, and the second germanium-including semiconductor layer is between the second 2D material layer and the second side surface of the channel layer.

12. The semiconductor device of claim 11, wherein the first 2D material layer and the first germanium-including semiconductor layer are bent and extend from the first side surface of the channel layer to a first region of an upper surface of the channel layer, and the second 2D material layer and the second germanium-including semiconductor layer are bent and extend from the second side surface of the channel layer to a second region of the upper surface of the channel layer.

13. The semiconductor device of claim 1, further comprising:

a gate insulating layer; and a gate electrode on the gate insulating layer, wherein the first semiconductor layer includes a channel layer, and the gate insulating layer on an upper surface of the channel layer.

14. The semiconductor device of claim 13, wherein the second semiconductor layer includes a first germanium-including semiconductor layer on the upper surface of the channel layer and a second germanium-including semiconductor layer on the upper surface of the channel layer, the first germanium-including semiconductor layer and the second germanium-including semiconductor layer are separated from each other, and the gate insulating layer is between the first germanium-including semiconductor layer and the second germanium-including semiconductor layer.

15. The semiconductor device of claim 14, wherein the 2D material layer includes a first 2D material layer on the first germanium-including semiconductor layer and a second 2D material layer on the second germanium-including semiconductor layer, and the metal layer includes a source electrode on the first 2D material layer and a drain electrode on the second 2D material layer.

16. The semiconductor device of claim 15, wherein a lower surface of the first germanium-including semiconductor layer is in direct contact with the channel layer, an upper surface of the first germanium-including semiconductor layer is in direct contact with the first 2D material layer, a lower surface of the second germanium-including semiconductor layer is in direct contact with the channel layer, and an upper surface of the second germanium-including semiconductor layer is in direct contact with the second 2D material layer.

* * * * *